United States Patent [19]

Ito et al.

[11] Patent Number: 5,159,571
[45] Date of Patent: Oct. 27, 1992

[54] SEMICONDUCTOR MEMORY WITH A CIRCUIT FOR TESTING CHARACTERISTICS OF FLIP-FLOPS INCLUDING SELECTIVELY APPLIED POWER SUPPLY VOLTAGES

[75] Inventors: Akira Ito, Kunitachi; Yoichi Sato, Iruma; Tosiyuki Ohkuma, Ohme, all of Japan

[73] Assignees: Hitachi, Ltd.; Hitachi VLSI Engineering Corp., both of Tokyo, Japan

[21] Appl. No.: 701,333

[22] Filed: May 9, 1991

Related U.S. Application Data

[63] Continuation of Ser. No. 291,643, Dec. 29, 1988, abandoned.

[30] Foreign Application Priority Data

Dec. 29, 1987 [JP] Japan .................. 62-335999

[51] Int. Cl.[5] .................. G11C 29/00; G11C 5/14; G11C 11/419
[52] U.S. Cl. .................. 365/201; 365/154; 365/156; 365/226; 365/218; 371/21.1; 371/21.4
[58] Field of Search .............. 365/154, 156, 201, 226, 365/95, 218; 371/21.1, 21.4

[56] References Cited

U.S. PATENT DOCUMENTS

| | | | |
|---|---|---|---|
| 3,533,087 | 10/1970 | Zuk | 365/156 |
| 3,535,699 | 10/1970 | Gaensslen et al. | 365/156 |
| 3,757,313 | 9/1973 | Hines et al. | 365/154 |
| 3,764,825 | 10/1973 | Stewart | 365/154 |
| 4,120,047 | 10/1978 | Varadi | 365/190 |
| 4,409,679 | 10/1983 | Kurafuji et al. | 365/190 |
| 4,780,897 | 10/1988 | Ito | 365/154 |
| 4,835,458 | 5/1989 | Kim | 365/201 |

FOREIGN PATENT DOCUMENTS

| | | | |
|---|---|---|---|
| 0041585 | 4/1981 | Japan | 365/154 |
| 0083117 | 5/1985 | Japan | 365/201 |
| 0090399 | 5/1986 | Japan | 365/201 |
| 0268189 | 11/1988 | Japan | 365/226 |

Primary Examiner—Glenn Gossage
Attorney, Agent, or Firm—Antonelli, Terry, Stout & Kraus

[57] ABSTRACT

A static random access memory (RAM) includes a data set circuit (DSC) coupled to pairs of load elements of memory cells to test the connection between a pair of load elements and a pair of memory nodes of each of the memory cells. The data set circuit responds to predetermined control signals and data to be set to the memory cells and supplies the predetermined voltage corresponding to such data to the pair of load elements. If the pair of load elements and the memory nodes of a memory cell are properly coupled, data of the memory cell will be inverted. Therefore, if the data of a memory cell is not inverted during the test, it can be quickly determined that a disconnection fault exists at that memory cell location.

9 Claims, 7 Drawing Sheets

SEMICONDUCTOR MEMORY WITH A CIRCUIT FOR TESTING CHARACTERISTICS OF FLIP-FLOPS INCLUDING SELECTIVELY APPLIED POWER SUPPLY VOLTAGES

This application is a continuation of application Ser. No. 291,643, filed on Dec. 29, 1988, now abandoned.

BACKGROUND OF THE INVENTION

The present invention relates to a semiconductor memory and particularly to an arrangement which may be effectively applied to a static random access memory (hereinafter referred to as static RAM or SRAM) including memory cells comprising flip-flops. More specifically, the present invention relates to an arrangement which may be effectively applied to testing characteristics of static memory cells.

Generally, the static memory cells included in a static RAM include flip-flops as the storage means. Each flip-flop includes a pair of inverter circuits in which the input and output are cross-coupled. Each inverter circuit includes a load element and a drive element which are connected in series between the first and second operation power source voltages ($V_{CC}$ and $V_{GND}$) of the static RAM. The load element is typically formed by a high resistance element of polycrystalline silicon (poly-Si) or a P channel metal-oxide-semiconductor field effect transistor (MOSFET), while the drive element is formed by an N channel MOSFET.

On the other hand, in order to obtain a static RAM of large capacity, a pair of load elements and a pair of drive elements included in each memory cell are arranged with regard to size and layout of each element to reduce the layout area of the memory cells. As a result, recently, the memory capacity of static RAMs has been improved to 256 kbits or even up to 1 Mbits through the progress in semiconductor manufacturing technology and the improvement in memory cell layout.

The testing of such large capacity memory devices and particularly the testing of memory cell characteristics requires a longer period of time due to its extensive memory capacity, resulting in an increase of testing cost and a resultant increase in product cost.

SUMMARY OF THE INVENTION

It is therefore an object of the present invention to provide a static semiconductor memory device which reduces the testing time of memory cells.

It is another object of the present invention to shorten the testing time of logical integrated circuits comprising static RAMS and to realize cost reduction thereof.

These and other objects and the novel features of the present invention will become apparent from the ensuing description with reference to the accompanying drawings. FIGS. 2(a) and 2(b) indicate problems which have been made apparent by the inventors of the present invention. Such problems are described hereunder with reference to FIGS. 2(a) and (b).

FIG. 2(a) indicates a memory cell MC as the storage means of the static RAM, a word line W0, complementary data line pair D0, D0 and pullup MOSFETs Q25, Q26. The static memory cell of FIG. 2(a) allows the memory information of logic "1" and "0" to be input to a pair of input/output nodes a and b of a flip-flop including MOSFETs Q3, Q4, Q37 and Q38 from the corresponding complementary data line pairs D0 and D0 through the transmission gate MOSFETs Q39 and Q40. Corresponding to such information, the flip-flop circuit is set (condition holding the logic "1") or reset (condition holding the logic "0"). Namely, the memory information is held in the form of charge in the gate capacitance of the drive MOSFETs Q37 and Q38, and the leakage of this charge is compensated through the load MOSFET Q3 or Q4 which is set in a complementary manner to the ON state. For high integration density of the memory cells, the load MOSFETs Q3 and Q4 are minimized in size to be capable of providing the conductance to compensate for the leakage of charge. FIG. 2(b) shows the enlarged view of MOSFETs Q3, Q4, Q37 and Q38 within the memory cell MC of FIG. 2 (a) and the wirings X and Y within the memory cell. In this figure, S is a source diffusion layer and D is a drain diffusion layer. It should be noted herein that the drain diffusion layer D of the MOSFETs Q3, Q4, Q37 and Q38 is electrically connected with the wirings X and Y within the cell by polysilicon or aluminum at the points indicated by the letters A, B, C and E. As explained previously, the elements, load MOSFETs Q3 and Q4, are formed to be small in size. Therefore, the drain D of the load MOSFETs Q3 and Q4 is usually connected electrically to the wirings X and Y within the cell through a contact hole. Meanwhile, electrical connection between the drain D of the drive MOSFETs Q37 and Q38 and wirings X and Y within the cell is established usually through two or three contact holes since the drive MOSFETs Q37 and Q38 are formed to be large in size. Accordingly, it has become clear that the possibility of an electrical connection failure (disconnection) becomes high at the portion indicated by A and B in the same figure, namely at the contact part because of the small contact area between the drains of Q3 and Q4 and the wirings X and Y. Generation rate of such connection failures can be estimated to become particularly high when the layout area of the memory cells is reduced for purposes of seeking improvement of high integration density. On the other hand, connection failure seldom occurs at the portions indicated by C and E because of the large contact area between the drains of Q37 and Q38 and the wirings X and Y.

FIG. 2(a) indicates the portions corresponding to the contact parts A and B with the mark X. If disconnection occurs at the part given the mark X, namely, if the source-drain path of load MOSFETs Q3 or Q4 is not connected with the memory nodes a and b, the memory data can be normally held for the period corresponding to the dynamic information holding time by the charge stored in the gate capacitor Cg of the drive MOSFET Q37 or Q38. Therefore, it can easily appear during a conventional test of the memory cell characteristics that the load MOSFET of the memory cell is connected with the memory node even though it is actually not connected.

When the read or write tests are attempted to all memory cells in order to eliminate such a problem with a time interval longer than the discharge time of the gate capacitor, namely, the dynamic information holding time of the memory cell, the testing time becomes longer and manufacturing cost increases. Moreover, it has also been considered to shorten the testing time by lowering the power supply voltage or raising the peripheral temperature and curtailing the dynamic information holding time of the memory cell. However, when the static RAM is used in a logic integrated circuit such as a microcomputer, it is quite probable that the test circuit arranged in the periphery of static RAM, for example, a register or latch circuit to hold the data to be written into the static RAM or the data to be output from the static RAM during the testing by the scan-path method, may be operated erroneously because the power supply voltage is lowered or the peripheral temperature becomes high. Therefore, reliability of the test result sometimes may be lowered.

A typical example of the invention among those disclosed in the present application will be briefly explained hereunder.

In the prior art, writing of information into the memory cell has been conducted by setting a pair of transmission gates MOSFETs to the ON state and inputting the complementary signals on the complementary data line pair to the flip-flop circuit. Therefore, if the connection between the load element in the flip-flop and the memory node is defective, such connection failure cannot be found within a short period. A discussion of specific prior art examples concerning initial set and/or reset of a static RAM, which suffer from this problem, is provided near the end of the detailed description. The present invention conducts data writing into the memory cell through the load element during the testing in order to find such connection failure within a short period. In practice, a single voltage supply line is provided respectively to each of a pair of load elements in the memory cell. A voltage supply means which supplies the first operating voltage ($V_{cc}$) and the second operating voltage (GND) of the circuit is respectively connected to the voltage supply lines. A pair of voltage supply means usually supply the first operating voltage ($V_{cc}$) to a pair of voltage supply lines but such supply voltage is varied responding to the test signal and data to be written into the memory cell during the testing. Namely, a pair of voltage supply lines receive the first operating voltage and the second operating voltage, or the second operating voltage and the first operating voltage from the voltage supply means.

According to the present invention, during the testing, data writing into the memory cell can be executed only by controlling a pair of voltage supply means with a control signal. Namely, data writing into the memory cell can be executed within a short period without the necessity of using an ordinary writing method.

In addition, inversion of data held in the memory cell can also be executed within a short period under the control of a pair of voltage supply means. Inversion of data held in the memory cell is executed for deciding whether the connection between the load element and the memory node is normal or not. Namely, in case the load element is connected with the memory node, data being held can be inverted. Meanwhile, if the load element is not connected with the memory node, data held cannot be inverted. This is the case since data writing into the memory cell is realized through a pair of load elements. Therefore, the voltage of a memory node of a memory cell cannot be varied to the voltage which is required for data inversion. In this case, a pair of MOSFETs are simultaneously set to ON or maintained in the preceding state continuously.

As explained earlier, since the testing time of a memory cell can be curtailed, the testing time of the static RAM or the logic integrated circuit including the same can also be curtailed, realizing reduction in cost.

DETAILED DESCRIPTION OF THE PREFERRED EMBODIMENTS

Figure 3:
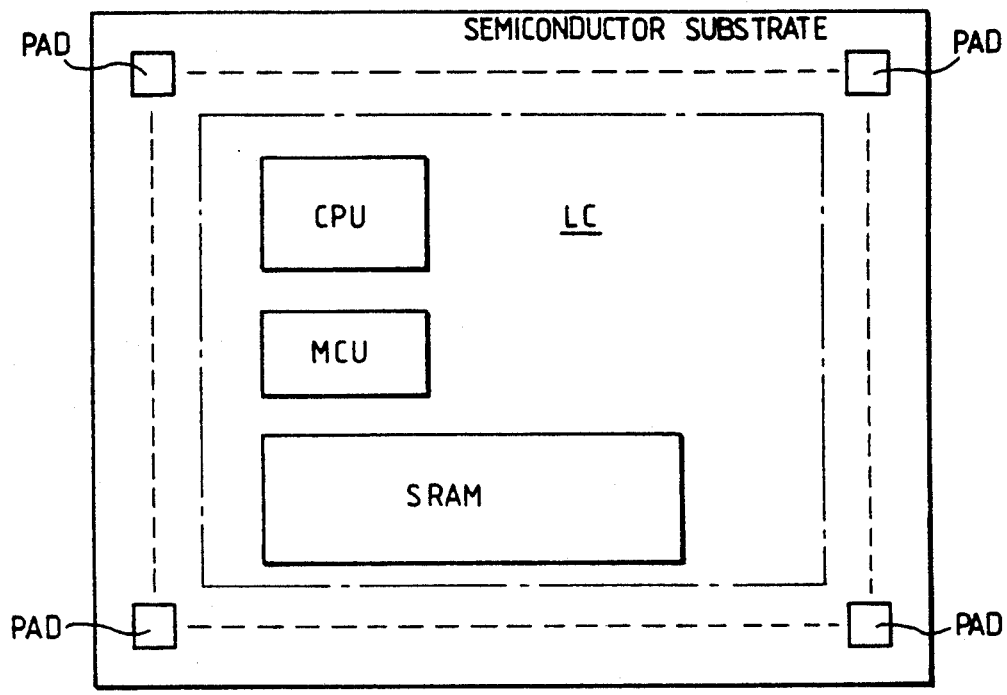
FIG. 3 is a plan view of a logic integrated circuit such as a single chip microcomputer such as a static RAM to which the present invention is applied.

A static RAM (SRAM) to which the present invention is applied is formed, for example, as shown in FIG. 3, in a semiconductor substrate like an N type single crystal, although not particularly limited, as a part of a logic integrated circuit LC such as a microcomputer. Such a microcomputer comprises, as shown in the same figure, a central processing unit CPU, a memory control unit MCU and static RAMs. These elements operate together as a data processor. Each pad is an external connecting terminal formed on a semiconductor substrate and is connected to the input/output terminal of an external device which is to be connected externally to the microcomputer.

Figure 4:
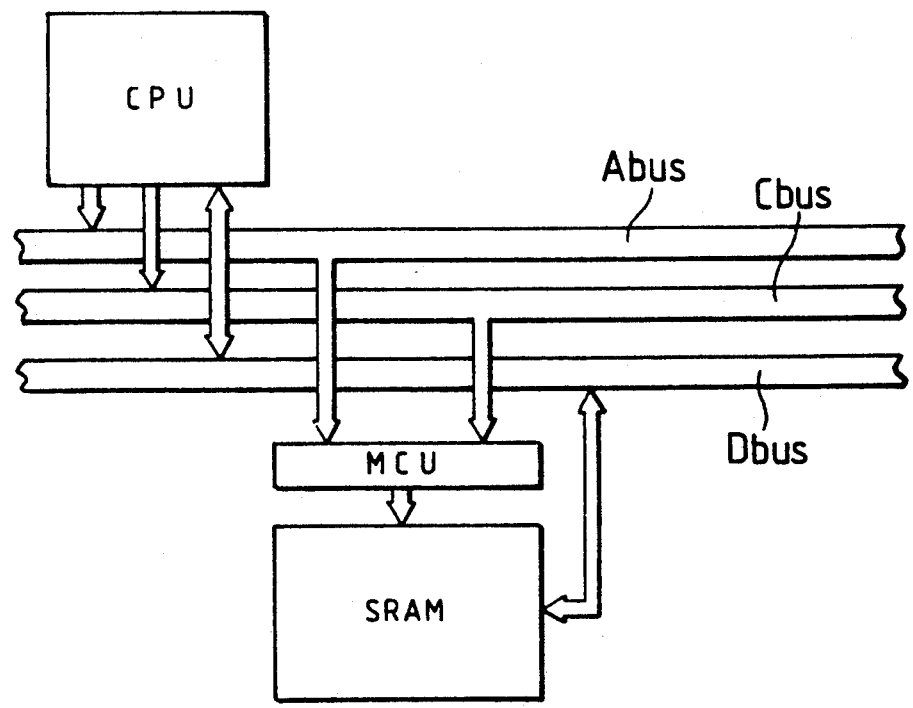
FIG. 4 is a system diagram of the logic integrated circuit of a microcomputer shown in FIG. 3.

FIG. 4 is a schematic system diagram of the microcomputer shown in FIG. 3. The microcomputer comprises, for example, an internal address bus A-bus, an internal control bus C-bus and an internal data bus D-bus. The central processing unit CPU is connected to output the address signal to the internal address bus A-bus and the control signal such as the read/write control signal to the internal control bus C-bus. Moreover, the central processing unit CPU is connected with the internal data bus D-bus through a two-way buffer so that it outputs data to the internal data bus D-bus or inputs data on the internal data bus D-bus. The memory control unit MCU is connected with the internal address bus A-bus and internal control bus C-bus and supplies the control signal such as address signal and chip select signal to the static RAM (SRAM) responding to the address signal on the internal address bus A-bus and the control signal on the internal control bus C-bus. This static RAM (SRAM) is coupled with the internal data bus D-bus to output data to the internal data bus D-bus and extracts data on the internal data bus D-bus responding to the address signal and control signal supplied from the memory control unit MCU.

Figure 1:
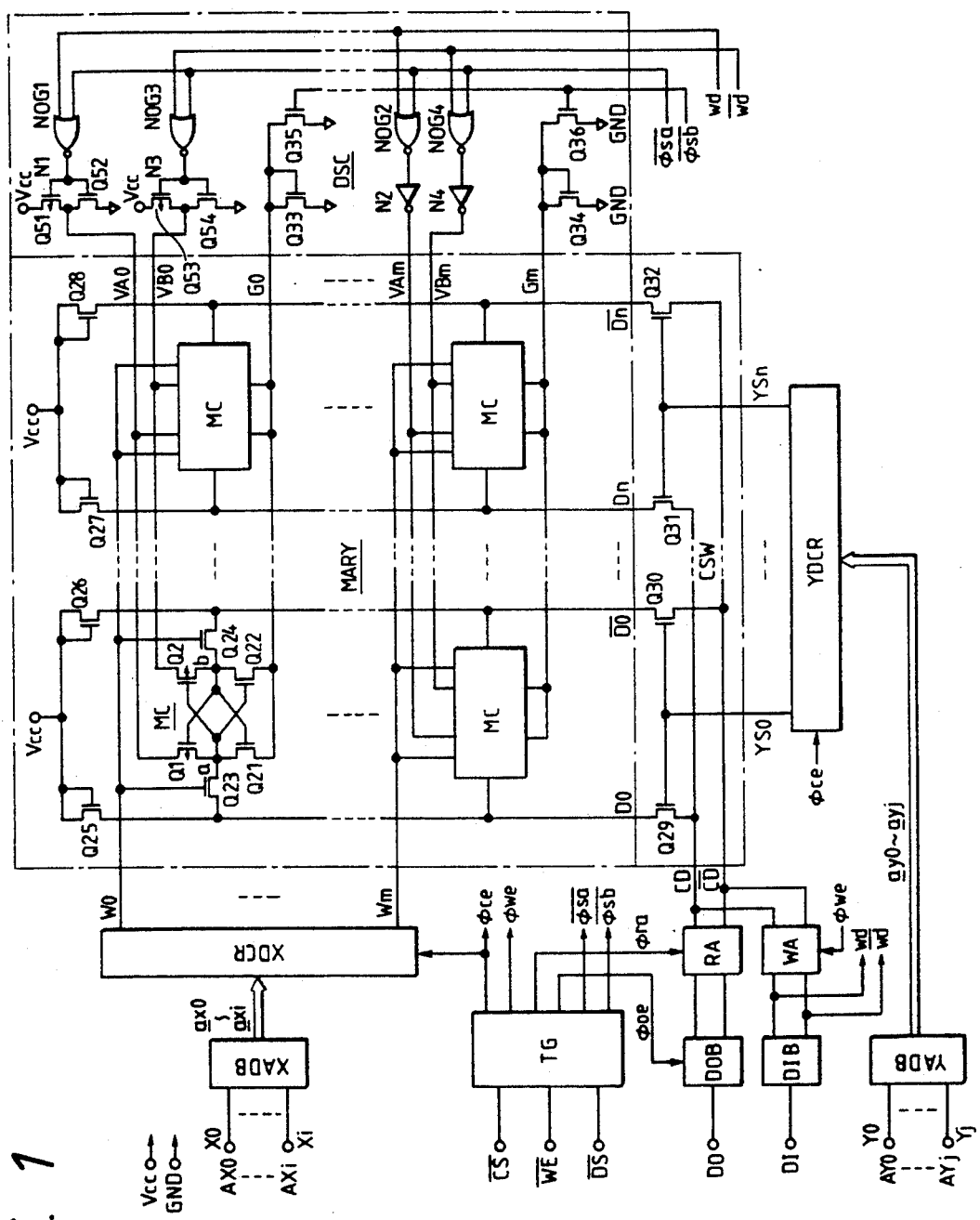
FIG. 1 is a circuit diagram of a static RAM to which the present invention is applied, indicating the condition that an output of the data set circuit DSC is supplied to the load MOSFET of a memory cell.
Figure 2A:
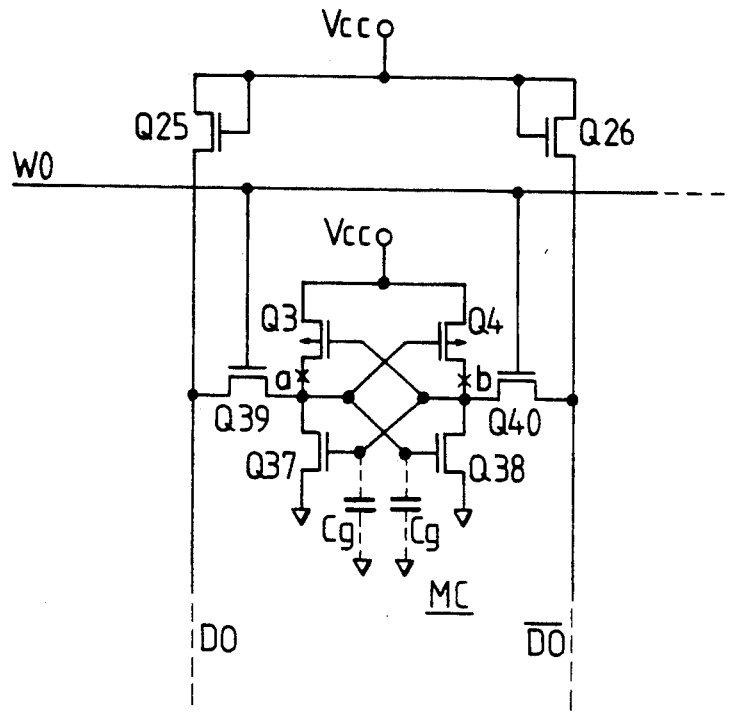
FIG. 2(a) and FIG. 2(b) are diagrams for explaining problems disclosed by the inventor of the present invention, in which FIG. 2(a) indicates that disconnection is easily generated at the part given the mark X of the memory cell MC, while FIG. 2(b) indicates the reason for such disconnection.
Figure 2B:
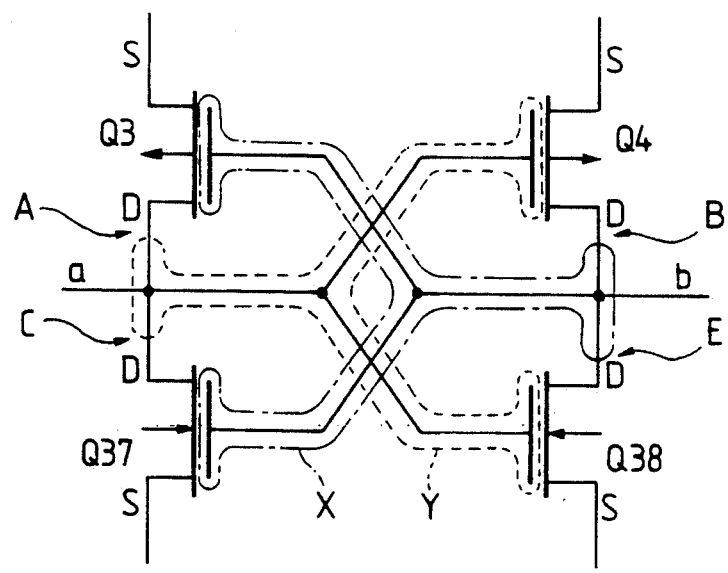

FIG. 1 is enlarged block diagram of a CMOS SRAM to which the present invention is applied. In FIG. 1, MOSFETs which have an arrow mark at the channel (back gate) part are of the P channel type, and are discriminated from the N channel MOSFETs to which the arrow mark is not given.

The static RAM of this embodiment is driven, although not particularly limited, when the chip selection signal $\overline{CS}$ changes to low level from high level. In this case, when the data set mode signal $\overline{DS}$ is high level, the static RAM is set to the ordinary operation mode and is also set selectively to the write operation mode or read operation mode with the write enable signal $\overline{WE}$. When the chip selection signal $\overline{CS}$ is changed to the low level, is such data set mode signal $\overline{DS}$ is low level, the static RAM is set to the data set mode. At this time, the static RAM selectively sets the data held in all memory cells MCs forming the memory array MARY to logic "0" or "1" depending on the write data supplied through the data input terminal DI.

In FIG. 1, the memory array MARY is formed by $m+1$ word lines $W_0 \sim W_m$ arranged in parallel in the horizontal direction, $n+1$ pairs of complementary data lines $D_0 \cdot \overline{D}_0 \sim D_n \cdot \overline{D}_n$ and $(m+1) \times (n+1)$ static memory cells MCs each of which is respectively coupled to a word line and a complementary data line pair.

Each of the memory cells MC, although not particularly limited, includes, as shown in FIG. 1 as an example, a first and a second CMOS inverter circuit (complementary MOS inverter circuit). The first inverter consists of the P channel MOSFET Q1 and N channel MOSFET Q21 connected in series therewith, while the second inverter consists of P channel MOSFET Q2 and N channel MOSFET Q22 in series therewith. In these inverter circuits, the N channel MOSFETs Q21 and Q22 function as the drive MOSFETs, while the P channel MOSFETs Q1 and Q2 serve as the load means for such drive MOSFETs. These pairs of inverter circuits are mutually cross-connected between the input terminal and output terminal, thereby forming a flip-flop circuit. The input terminals and output terminals of the two inverter circuits are connected in common as the input and output nodes a and b of the flip-flop circuit.

The input and output nodes a and b of the flip-flop circuit forming $(m+1)$ memory cells MCs arranged in the same column of memory array MARY are respectively connected to the corresponding complementary data line pairs $D_0 \cdot \overline{D}_0 \sim \overline{D}_n \cdot D_n$ through the corresponding pair of N channel transmission gate MOSFETs Q23 and Q24. The gates of transmission gate MOSFETs Q23 and Q24 of $n+1$ memory cells MCs arranged in the same row of the memory array MARY are connected in common to the corresponding word lines $W_0 \sim W_m$.

In the static RAM of this embodiment, the sources (second terminals) of the load MOSFET Q1 of $n+1$ memory cells arranged in the same row of the memory array MARY are respectively connected in common to the corresponding voltage supply lines $VA_0 \sim VA_m$ (second voltage supply lines). In the same way, the sources (third terminals) of the other load MOSFET Q2 of $n+1$ memory cells MCs arranged in the same row of memory array MARY are also connected in common to the corresponding voltage supply lines $VB_0 \sim VB_m$ (third voltage supply lines). Moreover, the sources (first terminals) of the drive MOSFETs Q21 and Q22 of $n+1$ memory cells MCs arranged in the same row of memory array MARY are respectively connected in common to the corresponding ground potential supply lines $G_0 \sim G_m$ (first voltage supply lines).

The voltage supply lines $VA_0 \sim VA_m$ are respectively connected, although not particularly limited, to the output terminals of corresponding CMOS inverter circuits $N_1 \sim N_2$ of data set circuit DSC. The P channel MOSFET Q51 and N channel MOSFET Q52 forming the inverter circuits $N_1 \sim N_2$ are designed to have comparatively large conductance in order to charge and discharge large parasitic capacitance of the voltage supply lines $VA_0 \sim VA_m$. The input terminals of inverter circuits $N_1 \sim N_2$ are connected to the output terminals of corresponding NOR gate circuits $NOG_1 \sim NOG_2$. One input terminal of each of the NOR gate circuits $NOG_1 \sim NOG_2$ receives in common the non-inverted internal write signal wd from the data input buffer DIB described later. The other input terminals of NOR gate circuits $NOG_1 \sim NOG_2$ receive in common the inversion timing signal $\overline{\phi}_{sa}$ from the timing generation circuit TG described later. As explained later, the non-inverted internal write signal wd is formed by the write data supplied through the data input terminal DI. Moreover, the inverted timing signal $\overline{\phi}_{sa}$ is set to the high level when the static RAM is in the ordinary operation mode or set to the low level temporarily at the determined timing when the static RAM is in the testing mode.

In the same way, the voltage supply lines $VB_0 \sim VB_m$ are connected, although not particularly limited, to the output terminals of corresponding CMOS inverter circuits $N_3 \sim N_4$ of the data set circuit DSC. The P channel MOSFET Q53 and N channel MOSFET S54 forming the inverter circuits $N_3$ and $N_4$ are designed to have comparatively large conductance in order to charge and discharge large parasitic capacitance of the voltage supply lines $VB_0 \sim VB_m$. The input terminals of inverter circuits $N_3 \sim N_4$ are further connected to the output terminals of the corresponding NOR gate circuits $NOG_3 \sim NOG_4$. One input terminal of each of the NOR gate circuits $NOG_3 \sim NOG_4$ receives in common the inverted internal write signal $\overline{wd}$ from the data input buffer DIB. Moreover, the other input terminals of NOR gate circuits $NOG_3 \sim NOG_4$ receive in common the inverted timing signal $\overline{\phi}_{sa}$ from the timing generation circuit TG. The inverted internal write signal $\overline{wd}$ is complementarily formed with the non-inverted internal write signal wd, in accordance with the write data supplied through the data input terminal DI.

In addition, the ground potential supply lines $G_0 \sim G_m$ are connected to the ground potential (first power supply voltage) of the circuit through the corresponding N channel MOSFETs $Q33 \sim Q34$ (first MOSFETs). These MOSFETs $Q33 \sim Q34$ are designed to have comparatively small conductance in the diode format through the connection of gates to the drains. The ground potential supply lines $G_0 \sim G_m$ are further connected to the ground potential of the circuit through the N channel MOSFETs $Q35 \sim Q36$ provided in parallel with the MOSFETs $Q33 \sim Q34$. These MOSFETs $Q35 \sim Q36$ are designed to have comparatively large conductance. The inverted timing signal $\overline{\phi}_{sb}$ is supplied in common to the gates of MOSFETs $Q35 \sim Q36$ from the timing generation circuit TG. This inverted timing signal $\overline{\phi}_{sb}$ is set to the high level when the static RAM is in the ordinary operation mode or to the low level temporarily with the inversion timing signal $\overline{\phi}_{sa}$ when the static RAM is in the determined testing mode.

Therefore, when the static RAM is in the ordinary operation mode and the inverted timing signal $\overline{\phi}_{sa}$ is in the high level, the output signal of NOR gate circuits $NOG_1 \sim NOG_2$ and $NOG_3 \sim NOG_4$ are all set to the low level without relation to the non-inverted internal write signal wd and inverted internal write signal $\overline{wd}$.

Accordingly, the output signals of inverter circuits $N_1 \sim N_2$ and $N_3 \sim N_4$ become high level and the power supply voltage $V_{cc}$ of the circuit (second power supply voltage) is supplied to the voltage supply lines $VA_0 \sim VA_m$ and $VB_0 \sim VB_m$ through the P channel MOSFETs of the CMOS inverter circuits $N_1 \sim N_2$ and $N_3 \sim N_4$. In this case, since the inverted timing signal $\overline{\phi}_{sb}$ is set to the high level in the same way, the MOSFETs $Q35 \sim Q36$ having comparatively large conductance are set to the ON state. Therefore, the ground potential of circuit is supplied to the ground potential supply lines $G_0 \sim G_m$ through MOSFETs $Q35 \sim Q36$ and $Q33 \sim Q34$ having comparatively small conductance. Thereby, all memory cells MCs of memory array MARY function as the ordinary static RAM memory cells.

When the static RAM is set to the predetermined testing mode and the inverted timing signals $\overline{\phi}_{sa}$ and $\overline{\phi}_{sb}$ are set temporarily to the low level, MOSFETs $Q35 \sim Q36$ having comparatively large conductance of the data set circuit DSC are set to the OFF state because the inverted timing signal $\overline{\phi}_{sb}$ is set to the low level. Therefore, the ground potential supply lines $G_0 \sim G_m$ are connected to the ground potential of the circuit through MOSFETs $Q33 \sim Q34$ having comparatively small conductance. Since the inverted timing signal $\overline{\phi}_{sa}$ is set to the low level in the data set circuit DSC, the output signals of NOR gate circuits $NOG_1 \sim NOG_2$ and $NOG_3 \sim NOG_4$ are selectively set to the high level depending on the non-inversion internal write signal wd and inverted internal write signal $\overline{wd}$. Namely, when the inverted timing signal $\overline{\phi}_{sa}$ is set to the low level, the write data supplied through the data input terminal DI is logic "0", and when the non-inverted internal write signal wd is set to the low level, the output signals of NOR gate circuits $NOG_1 \sim NOG_2$ are selectively set to the high level. Accordingly, the output signals of inverter circuits $N_1 \sim N_2$ are set to the low level and the ground potential of circuit is supplied to the voltage supply lines $VA_0 \sim VA_m$ through the N channel MOSFET Q52 of the inverter circuits $N_1 \sim N_2$. In this case, the output signals of NOR gate circuits $NOG_3 \sim NOG_4$ are set to the low level and the power supply voltage $V_{cc}$ of circuit is supplied to the voltage supply lines $VB_0 \sim VB_m$ through the P channel MOSFET Q53 of the inverter circuits $N_3$ and $N_4$. Therefore, all memory cells MCs forming the memory array MARY are reset to hold the memory data of logic "0" only when the load MOSFET Q1 functions normally. In this case, the ground potential supply lines $G_0 \sim G_m$ are connected to the ground potential of circuit, as explained previously, through the MOSFETs $Q33 \sim Q34$ having comparatively small conductance. Therefore, the level difference of nodes a and b of the flip-flop circuit of each memory cell MC is compressed and the inverting operation rate to the reset condition of each memory cell MC is improved. If a failure such as disconnection is generated in any memory cell MC and a load MOSFET Q1 does not function normally, such memory cell MC keeps the node b in the low level and cannot be inverted to the reset condition from the set condition.

When the inverted timing signal $\overline{\phi}_{sa}$ is set to the low level, the write data supplied through the data input terminal DI is logic "1" and the inverted internal write signal $\overline{wd}$ is set to the low level, the output signals of NOR gate circuits $NOG_3 \sim NOG_4$ are set selectively to the high level. Accordingly, the output signals of inverter circuits $N_3 \sim N_4$ become the low level, and the ground potential of the circuit is supplied to the voltage supply lines $VB_0 \sim VB_m$ through the N channel MOSFET Q54 of the inverter circuits $N_3 \sim N_4$. Here, the output signals of NOR gate circuits $NOG_1$ $NOG_2$ are set to the low level and the power supply voltage $V_{cc}$ is supplied to the voltage supply lines $VA_0 \sim VA_m$. Moreover, the ground potential supply lines $G_0 \sim G_m$ are connected, as explained previously, to the ground potential of the circuit through the MOSFETs $Q33 \sim Q34$ having comparatively small conductance. Therefore, all memory cells MC forming the memory array MARY are set to the set condition to keep the memory data of logic "1" only when the load MOSFET Q2 functions normally. If a failure such as disconnection occurs in any memory cell MC and the load MOSFET Q2 does not function normally, such memory cell MC keeps the node a at the low level and cannot be inverted to the set condition from the reset condition.

As will be understood from the above explanation, the output levels of NOR gates $NOG_1$, $NOG_2$ are set complementarily to the output levels of NOR gates $NOG_3$, $NOG_4$ in the data set mode. Namely, the NOR gates $NOG_1$, $NOG_2$ and NOR gates $NOG_3$, $NOG_4$ are operated complementarily.

In FIG. 1, the word lines $W_0 \sim W_m$ forming the memory array MARY are connected to the X address decoders XDCRs and the desired one is selected therefrom depending on the X address signals $AX_0 \sim AX_i$.

To the X address decoders XDCRs, the i+1 bits complementary internal address signals $ax_0 \sim ax_i$ (here, for example, the complementary internal address signal $ax_0$ means the signal combining the non-inverted internal address signal $ax_0$ and inverted internal address signal $\overline{ax_0}$) are supplied from the X address buffers XADBs described later. Moreover, the timing signal $\phi_{ce}$ is supplied from the timing generation circuit TG. This timing signal $\phi_{ce}$ is generally set to the low level and is then set to the high level at the determined timing when the static RAM is in the set condition.

The X address decoders XDCRs are selectively set to the operating condition when the timing signal $\phi_{ce}$ is set to the high level. Under this operating condition, the X address decoders XDCRs decode the complementary internal address signals $ax_0 \sim ax_i$ and set the corresponding one of the word lines $W_0 \sim W_m$ to the selected condition of high level.

The X address buffers XADBs fetch the X address signals $AX_0 \sim AX_i$ supplied to the address input terminals $X_0 \sim X_i$ from the memory control unit MCU in the logic integrated circuit and hold such X address signals. In addition, these buffers form the complementary internal address signals $ax_0 \sim ax_i$ based on these X address signals $AX_0 \sim AX_i$ and supply such signals to the X address decoders XDCRs. The X address signal input to the address input terminal may be supplied from the outside.

The complementary data line pairs $D_0 \cdot \overline{D}_0 \sim D_n \cdot \overline{D}_n$ forming the memory array MARY are connected, on one hand, to the power supply voltage $V_{cc}$ of the circuit through the corresponding MOSFETs $Q25 \cdot Q26 \sim Q27 \cdot Q28$. These MOSFETs are formed as the diode format through common connection of the gate and drain thereof and function as the load MOSFETs for the complementary data line pairs $D_0 \cdot \overline{D}_0 \sim D_n \cdot \overline{D}_n$.

The complementary data line pairs $D_0 \cdot \overline{D}_0 \sim D_n \cdot \overline{D}_n$ forming the memory array MARY are connected, on the other hand, to the corresponding switch MOSFETs Q29·Q39~Q31·Q32 of the column switch CSW. The other part of these switch MOSFETs are connected respectively in common to the non-inverted signal line CD and inverted signal line $\overline{CD}$ of the complementary common data line pair. The gates of switch MOSFETs of each pair are respectively connected in common and the corresponding data line pair selection signals $YS_0$~$YS_n$ are supplied thereto from the Y address decoder YDC. Thereby, each switch MOSFET of column switch CSW is turned ON when the corresponding data line selection signals $YS_0$~$YS_n$ are selectively set to the high level and selectively connects the corresponding complementary data line pairs $D_0 \cdot \overline{D}_n$~$D_n \cdot \overline{D}_n$ and the complementary common data line pairs CD·$\overline{CD}$.

The j+1 bits complementary internal address signals $ay_0$~$ay_j$ are supplied to the Y address decoders YDCRs from the Y address buffers YADBs described later. In addition, the timing signal $\phi_{ce}$ explained above is supplied from the timing generation circuit TG.

The Y address decoders YDCR are selectively set to the operating condition when the timing signal $\phi_{ce}$ is set to the high level. Under this operating condition, the Y address decoders YDCR decode the complementary internal address signals $ay_0$~$ay_j$ and selectively set the corresponding data line pair selection signasl $YS_0$~$YS_n$ to the high level.

The Y address buffers YADB fetch the Y address signals $AY_0$~$AY_j$ supplied to the address input terminals $Y_0$~$Y_j$ from the memory control unit MCU in the logic integrated circuit and hold such signals. These buffers also form the complementary internal address signals $ay_0$~$ay_j$ based on these Y address signals $AY_0$~$AY_j$ and supply these signals to the Y address decoders YDCR. The Y address signal supplied to the address input terminal may be supplied from the outside.

The input terminal of read amplifier RA is connected, although not particularly limited, to the complementary common data line pair CD·$\overline{CD}$ and the output terminal of write amplifier W is also connected thereto. The output terminal of read amplifier RA is further connected to the input terminal of data output buffer DOB. Morever, the input terminal of write amplifier WA is further connected to the output terminal of data input buffer DIB. To the read amplifier RA, write amplifier WA and data output buffer DOB, the timing signals $\phi_{ra}$, $\phi_{we}$ and $\phi_{oe}$ are respectively supplied from the timing generation circuit TG. The timing signals $\phi_{ra}$, $\phi_{oe}$ among them are set selectively to the high level in the determined timing when the static RAM is set to the selecting condition in the read operation mode. In addition, the timing signal $\phi_{we}$ is selectively set to the high level in the determined timing when the static RAM is set to the selecting condition in the write operation mode.

The read amplifier RA is set selectively to the operating condition when the timing signal $\phi_{ra}$ is set to the high level. Under this operating condition, the read amplifier RA amplifies the read signal output from the selected memory cell MC of memory array MARY through the complementary common data line pair CD·$\overline{CD}$ and transmits the signal to the data output buffer DOB.

When the timing signal $\phi_{oe}$ is set to the high level, the data output buffer DOB is set to the operating condition selectively. Under this operating condition, the data output buffer DOB transmits the read signal sent from the read amplifier RA to the data bus D-bus of the logic integrated circuit or to the outside through the data output terminal DO. When the timing signal $\phi_{oe}$ is set to the low level, an output of the data output buffer DOB is set to the high impedance condition.

The data input buffer DIB transmits the write data supplied from the data bus D-bus of the logic integrated circuit or from the external circuit to the write amplifier WA as the complementary internal write signal. These complementary write signals, namely the non-inverted internal write signal wd and inverted internal write signal $\overline{wd}$ are also supplied to the data set circuit DSC as explained earlier.

The write amplifier WA is selectively set to the operating condition when the timing signal $\phi_{we}$ is set to the high level. Under this operating condition, the write amplifier WA forms complementary write currents depending on the complementary write signals wd and $\overline{wd}$ transmitted from the data input buffer DIB and supplies these signals to the selected memory cells MCs of memory array MARY through the complementary common data line pairs CD·$\overline{CD}$. When the timing signal $\phi_{we}$ is set to the low level, an output of the write amplifier WA is set to the high impedance.

The timing generation circuit TG forms various kinds of timing signals based on the chip selection signal $\overline{CS}$, write enable signal $\overline{WE}$ and data set mode signal $\overline{DS}$ supplied through the input terminal $\overline{CS}$, $\overline{WE}$ and $\overline{DS}$ from the memory control unit MCU of the logic integrated circuit and an external circuit and supplies such timing signals to respective circuits.

Figure 5:
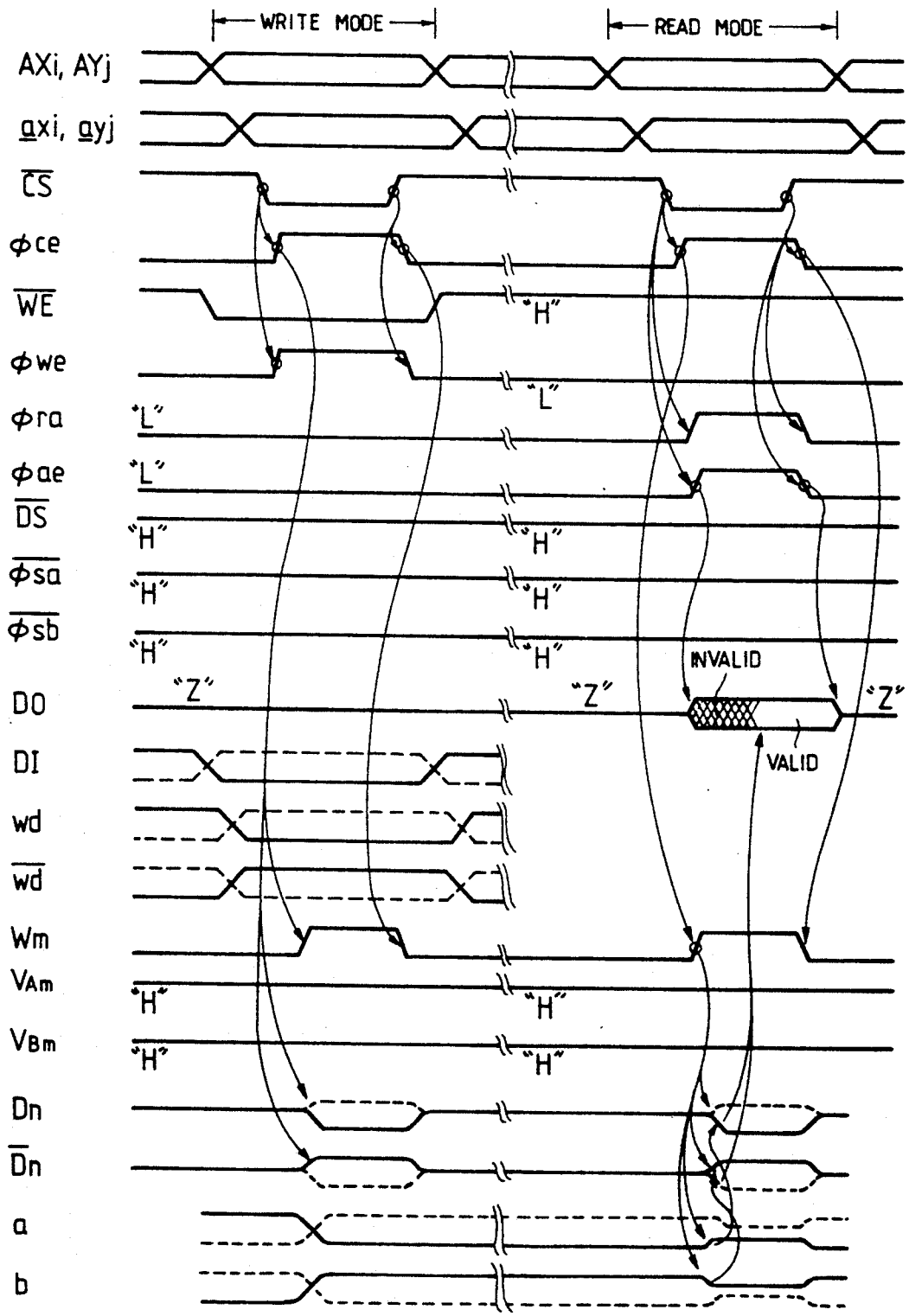
FIG. 5 indicates the timing charts in the ordinary write operation mode and read operation mode of a static RAM to which the present invention is applied.
Figure 6:
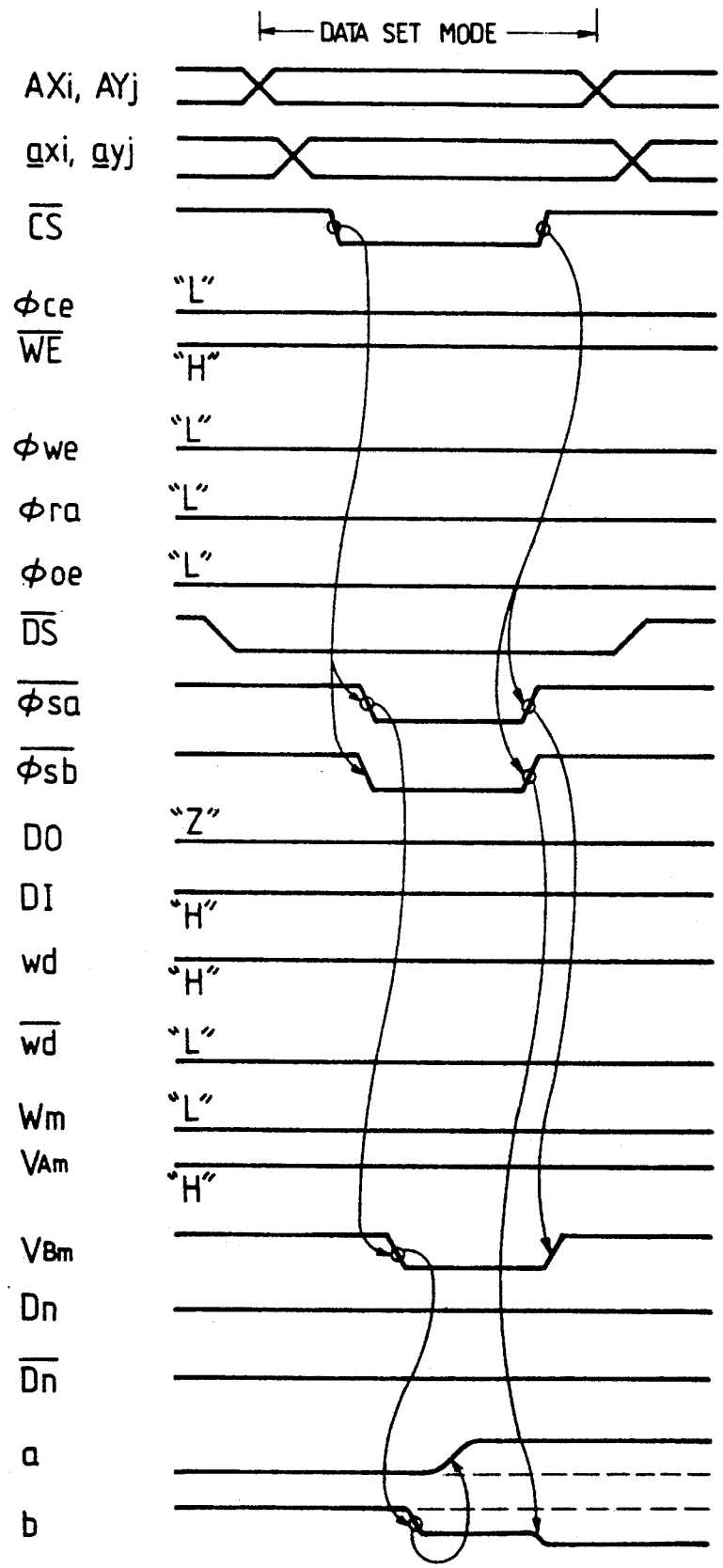
FIG. 6 indicates the timing charts of a data set mode of the static RAM to which the present invention is applied.

FIG. 5 and FIG. 6 indicate the operation timing of a static RAM in this embodiment. FIG. 5 indicates the operation timings of the ordinary write mode and ordinary read mode and FIG. 6 indicates the operation timing of the data set mode of the present invention.

In the static RAM of this embodiment, the testing operation for confirming the information holding characteristic of memory cell MC can be conducted, for example, as explained below. Namely, the static RAM is, although not particularly limited, first set to the repeated selective condition by the ordinary write operation mode, and the memory data of logic "0", for example, is written to all memory cells MCs of memory array MARY. In this case, the data set mode signal $\overline{DS}$ is set to the high level and the write data of logic "0" is supplied from the data bus D-bus or external circuit through the data input terminal DI.

The ordinary write operation mode is executed in the timing indicated as the write mode in FIG. 5. Namely, the write operation mode is indicated by the low level of write enable signal $\overline{WE}$ and when the chip select signal $\overline{CS}$ is set to the low level, the timing signals $\phi_{ce}$ and $\phi_{we}$ are set to the high level. Responding to these signals, the word line $W_m$ corresponding to the internal complementary address signal $ax_i$ is activated, setting the potential of the word line $W_m$ to the high level. Moreover, responding to the data (indicated by a solid line) of low level supplied to the data input terminal DI, the non-inverted internal write signal wd and the inverted internal write signal $\overline{wd}$ are changed as indicated by a solid line and the data line pair selection signals $YS_n$ are output from the Y address decoders YDCRs responding to the high level of timing signal $\phi_{ce}$ and internal complementary address signal $ay_j$. When the corresponding switch MOSFET in the column switch CSW is turned on by the data line pair selection signal $YS_n$, the potentials of complementary data line pair Dn and $\overline{Dn}$ are changed as indicated by a solid line.

Thereby, the potentials of memory nodes a and b of the selected memory cells MCs are changed as indicated by the solid line and the logic "0" is written into the memory cells MCs. Thereafter, the timing signals $\phi_{ce}$ and $\phi_{we}$ are changed to the low level, responding to a change of chip select signal $\overline{CS}$ to the high level. The potential of word line $W_m$ is set to the low level, namely to the non-selecting level, responding to the low level of timing signal. The timing signals $\phi_{ra}$ and $\phi_{oe}$ are set to the low level, while the data set mode signal $\overline{DS}$, inverted timing signals $\overline{\phi_{sa}}$ and $\phi_{sb}$, voltage supply line $VA_m$, and potential of $VB_m$ are maintained at the high level. In case the logic "1" is written into the memory cell MC from the data input terminal DI, non-inverted and inverted internal write signals wd and $\overline{wd}$ are set to the level indicated by a dotted line and thereby, the potentials of complementary data line pair $D_n$ and $\overline{D}_n$ and memory nodes a and b of memory cell MC are set to the level indicated by the dotted line.

Upon completion of a write operation to all memory cells MCs of memory array MARY, the static RAM is repeatedly set to the selective condition with the ordinary read operation mode and it can be confirmed that the memory data of logic "0" is written to all memory cells MCs. In this case, the read data of logic "0" read from the memory cell MC is transmitted through the data output terminal $\overline{DO}$.

The ordinary read operation mode is executed at the timing indicated as read mode in FIG. 5. Namely, the read operation mode is indicated by the high level of write enable signal $\overline{WE}$ and the low level of the chip select signal $\overline{CS}$, which sets the timing signals $\phi_{ce}$, $\phi_{ra}$ and $\phi_{oe}$ to the high level. Responding to the high level of timing signal $\phi_{ce}$, the word line $W_m$ corresponding to the internal complementary address signal $ax_i$ is set to the selective condition. Namely, the potential of word line $W_m$ is set to the high level and the complementary data line pair $D_n \cdot \overline{D}_n$ corresponding to the internal complementary address signal $ay_j$ are set to the selective condition. Responding to the high level of word line $W_m$, the potentials of complementary data line pair $D_n \cdot \overline{D}_n$ and memory nodes a, b of selected memory cell change as indicated by a solid line. Responding to the high level of timing signal $\phi_{oe}$, the data output buffer DOB is activated and, therefore, invalid data is output from the data output terminal DO, but valid data (logic "0") is output from the data output terminal DO after a certain period responding to the voltage change of memory nodes a, b and the voltage change of complementary data line pair $D_0 \cdot \overline{D}_0$. Thereafter, when the chip select signal $\overline{CS}$ is set to the high level, the timing signals $\phi_{ce}$, $\phi_{ra}$ and $\phi_{oe}$ are set to the low level. Responding to the low level of the timing signal $\phi_{ce}$, the word line $W_m$ is not selected and the voltage thereof is set to the low level. Responding to the low level of timing signal $\phi_{oe}$, an output of the data output buffer DOB is set to the high impedance condition.

The timing signal $\phi_{we}$ is maintained to the low level, and the data set mode signal $\overline{DS}$, the potential of inverted timing signals $\overline{\phi_{sa}}$ and $\phi_{sb}$ and voltage supply lines $VA_m$, $VB_m$ are maintained to the high level. Moreover, in case the memory data of memory cell MC is logic "1", potential of the complementary data line pair $D_0 \cdot \overline{D}_0$ and memory nodes a, b changes as indicated by a dotted line.

As explained above, the testing of the circuit used for the ordinary operation mode can be conducted by writing or reading data to or from all memory cells in the ordinary write operation mode and read operation mode.

Next, the static RAM is set to the data set mode and the memory data of all memory cells MCs of memory array MARY are inverted to the logic "1". In this case, the data set mode signal $\overline{DS}$ is set to the low level and the write data of logic "1" is supplied to the data input terminal DI. In the data set mode of the static RAM, the inverted timing signals $\overline{\phi_{sa}}$ and $\phi_{sb}$ are supplied to the data set circuit DSC from the timing generation circuit TG and the high level non-inverted internal write signal wd and low level inverted internal write signal $\overline{wd}$ are also supplied from the data input buffer DIB. As a result, as explained previously, the memory data of all memory cells MCs of memory array MARY are converted to logic "1" at a time within a short period of time.

The data set mode can be executed at the timing of the data set mode in FIG. 6. Namely, the data set is indicated with the low level of data set mode signal DS and when the chip select signal $\overline{CS}$ is set to the low level, while the inverted timing signals $\overline{\phi_{sa}}$ and $\phi_{sb}$ are set to the low level. Responding to the low level of the inverted timing signal $\overline{\phi_{sa}}$ and the low level of inverted internal write signal $\overline{wd}$, the potential of voltage supply line $VB_m$ is changed to the low level from the high level. The potential of voltage supply line $VA_m$ is maintained at the high level. In case the connection of load MOSFET $Q_2$ connected to the side of memory node b of memory cell MC and the memory node b is normal, the potential of meomry node b begins changing toward the side of low level as indicated by a solid line, and eventually the potential of memory node b reaches the low level, as indicated by a solid line. At the same time, the potential of memory node a is changed to the high level side responding to it. As a result, the memory information of memory cell MC is changed to the logic "1" from the logic "0" at a high speed. If disconnection occurs between the load MOSFET Q2 and memory node b, the potential of memory nodes a and b does not change and is maintained as indicated by a dotted line. When the chip select signal $\overline{CS}$ is changed to the high level from the low level, the inverted timing signals $\overline{\phi_{sa}}$ and $\overline{\phi_{sb}}$ are changed to the high level. Responding to the change of inverted timing signal $\overline{\phi_{sa}}$ to the high level, the potential of voltage supply line $VB_m$ is changed to the high level. Responding to change of inverted timing $\overline{\phi_{sb}}$ to the high level, the MOSFETs Q35 and Q36 in the data set circuit DSC are turned ON and thereby the potential of memory node b is further changed to the side of low level. During the data set mode, the write enable signal $\overline{WE}$ is maintained at the high level and the timing signals $\phi_{ce}$, $\phi_{we}$, $\phi_{ra}$, $\phi_{oe}$ and potential of the word line $W_m$ remain at the low level while the data output terminal DO is set to the high impedance condition "Z".

Upon completion of inversion of the memory data by the data set mode, the static RAM is repeatedly set again to the selective condition by the ordinary read operation mode and it can be confirmed that the memory data of all memory cells MCs are inverted to the logic "1". At this time, if any memory cell MF outputs the readout data of logic "0", the load MOSFET Q2 of such memory cell MC is indicated, for example, as having a failure such as disconnection on the side of drain.

Moreover, the static RAM is set again to the data set mode and memory data of all memory cells MCs of memory array MARY are inverted to the logic "0". At this time, the data set mode signal $\overline{DS}$ is set to the low level, as in the case of FIG. 6, and the write data of logic "0" is supplied to the data input terminal DI. Namely, a low level signal is input to the data input terminal DI. Thereby, the non-inverted and inverted internal write signals wd and $\overline{wd}$ are respectively set to the low and high levels. In addition, the respective potentials of voltage supply lines $VA_m$ and $VB_m$ and respective potentials of memory nodes a and b are interchanged with each other.

When the second data set mode is completed, the static RAM is set again to the selective condition in the ordinary read operation mode, and it can be confirmed that the memory data of all memory cells MCs are inverted to the logic "0". At this time, if any memory cell MC outputs the read data of logic "1", it is decided, for example, that the load MOSFET Q1 of such memory cell MC has a failure such as disconnection on the side of the drain.

The memory cell characteristic testing processes are not limited only to the processes explained above, namely, (1) data "0" writing process by the ordinary write operation to all memory cells, (2) data "0" read process by the ordinary read operation from all memory cells, (3) data inversion (from "0" to "1") process by the data set circuit DSC, (4) data "1" read process by the ordinary read operation from all memory cells, (5) data inversion (from "1" to "0") process by the data set circuit DSC, and (6) data "0" rereading process by the ordinary read operation from all memory cells. The present invention, of course, allows possible changes or modifications. For example, in the case of only the inspection of memory cell characteristics, such inspection can be realized by the processes (1), (3) (4), (5) and (6) among those explained above. In this case, the process (1) may be replaced with the writing method using the data set circuit DSC.

Figure 7:
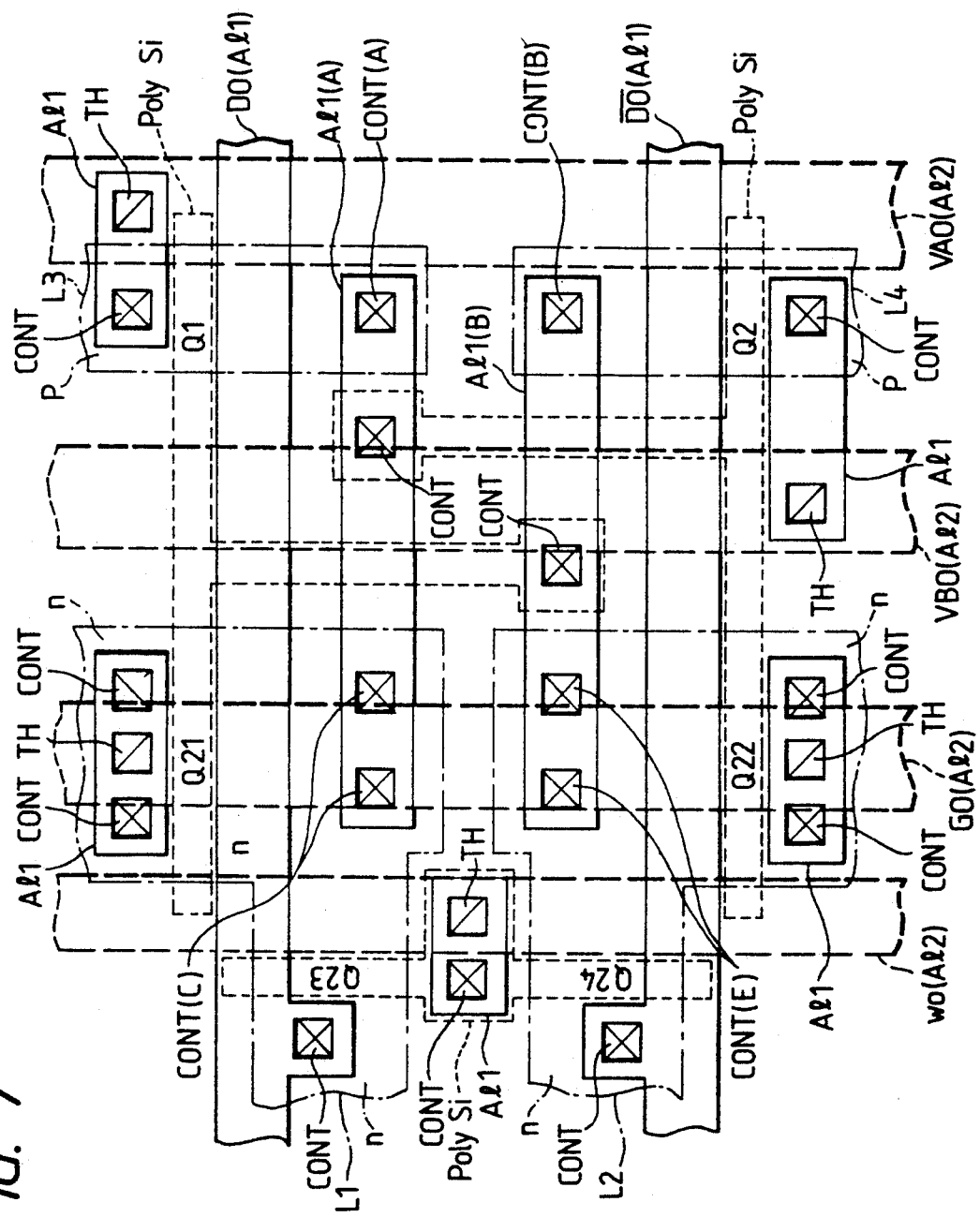
FIG. 7 is a plan view of a layout of a memory cell of a static RAM to which the present invention is applied.

FIG. 7 is a layout drawing corresponding to the CMOS static RAM shown in FIG. 1. This CMOS memory cell is formed by the single layer polycrystalline silicon layer poly-Si and double-layer aluminum wirings $Al_1$, $Al_2$. The polycrystalline silicon layer poly-Si is used for the gate electrodes of transfer MOSFETs Q23, Q24, gate electrodes of MOSFETs Q1 and Q21, gate electrodes of MOSFETs Q2 and Q22 and wirings within the cells, and is indicated by a dotted line in the figure. In this figure, the sign of the MOSFET is described to the part corresponding to the gate electrode of each MOSFET for helping understanding. In the figure, the chain lines L1, L2, L3 and L4 indicate the boundary between the field oxide film, for example, the oxide film (LOCOS oxide film) by the local oxidation of silicon technology and the element forming region. In the region surrounded by the chain line L1, the n type source-drain regions of MOSFETs Q21 and Q23 are formed by doping the n type impurity such as phosphorus or arsenic. As into the P type well formed within the semiconductor substrate with the gate electrodes formed by the LOCOS oxide film and polysilicon used as the ion doping mask. In the region surrounded by the chain line L2, the n type source-drain regions of the MOSFETs Q22 and Q24 are formed by doping the n type impurity such as phosphorus or arsenic As into the P type well formed within the semiconductor substrate with the gate electrodes formed by the LOCOS oxide film and the poly-silicon used as the mask. In the region surrounded by the chain lines L3 and L4, the P type source-drain regions of MOSFETs Q1 and Q2 are respectively formed by doping P type impurity such as boron B into the n type well formed within the semiconductor substrate with the gate electrodes formed by the LOCOS oxide film and polysilicon used as the impurity doping mask. The complementary data line pair $D_0$ and $\overline{D_0}$ can be formed by the first layer aluminum wiring $Al_1$. The first layer aluminum wiring $Al_1$ is further used, as indicated in the figure, for connection of the other wirings in the cell, polysilicon gate or source region and the second layer aluminum wiring $Al_2$. The second layer aluminum wiring $Al_2$ is used for word line $W_0$, ground potential supply line $G_0$ and first and second voltage supply lines $VA_0$ and $VB_0$. CONT indicates a contact hole and TH indicates a through hole.

In the same figure, it should be noted that connection between the drain regions and aluminum wirings $Al_1(A)$, $Al_1(B)$ is respectively realized through a pair of contact holes as indicated by CONT (C) and CONT (E).

Meanwhile, connection between the aluminum wirings $Al_1(A)$ and $Al_1(B)$ and the load MOSFETs Q1 and Q2 is respectively carried out through a contact hole as indicated by CONT(A) and CONT(B). Therefore, it can be understood that electrical conductivity failure easily occurs at the contact holes CONT(A) and CONT(B) more often than at the contact holes CONT(C) and CONT(E).

As explained earlier, the static RAM of this embodiment comprises the memory array MARY as the basic structure in which the CMOS static memory cells MC are arranged like a lattice. Each memory cell MC comprises a flip-flop circuit formed by a pair of cross-connected CMOS inverter circuit consisting of P channel type load MOSFETs and N channel type drive MOSFETs arranged in series. The source of the P channel MOSFET forming one inverter circuit is connected in common respectively to the corresponding voltage supply lines $VA_0 \sim VA_m$ and source of P channel MOSFET forming the other inverter circuit is connected in common respectively to the corresponding voltage supply lines $VB_0 \sim VB_m$. Moreover, the sources of N channel MOSFETs forming both inverter circuits are connected in common respectively to the corresponding ground potential supply lines $G_0 \sim G_m$. The power supply voltage $V_{cc}$ of the circuit is supplied to the voltage supply lines $VA_0 \sim VA_m$ and $VB_0 \sim VB_m$ while the static RAM is in the ordinary operation mode. When the static RAMs are set to the predetermined testing mode, namely to the data set mode, the ground potential of the circuit is supplied to any of the static RAMs depending on the inverted timing signals $\phi_{sa}$, $\phi_{sb}$ and complementary internal write signals wd, $\overline{wd}$. This ground potential of the circuit is supplied to the ground potential supply lines $G_0 \sim G_m$ through the MOSFETs Q35 Q36 usually having comparatively large conductance and MOSFETs Q33~Q34 usually having comparatively small conductance. Moreover, when such inverted timing signals $\phi_{sa}$ and $\phi_{sb}$ are set to the low level, the ground potential of circuit is supplied through only the MOSFETs Q33~Q34 having comparatively small conductance. From these facts, the memory data of all memory cells MCs of memory array MARY can be forced to become logic "0" or logic "1" depending on the write data in the static RAM of this embodiment. Moreover, whether the load MOSFETs Q1 and Q2 of memory cell MC are normal or not can be decided by setting this data set mode while the memory data is inverted. Thereby, the testing time of static RAM can be curtailed and low cost can be accelerated for logic integrated circuits comprising static RAMs. Further, it is advantageous that these testing operations do not require lowering the power supply voltage of the logic integrated circuits or raising the peripheral temperature.

The data set mode explained above can be used for initial setting of the static RAM.

As mentioned earlier in the "Background of the Invention", a number of prior art arrangements have been developed concerning initial set or/and initial reset of a static RAM. One of them is the Japanese laid-open patent No. 61-222090, laid open on Oct. 2, 1986, and European patent provisional publication No. 189700-A2 laid open on Aug. 6, 1986, based on the U.S. patent application Ser. No. 07/686964 (application date: Dec. 28, 1984; Inventor: Mark G. Jonson; Assignee: Tomson Components Mostek Corporation), now abandoned. The other is the Japanese laid-open patent No. 62-71088 invented by Akira Itoh, an inventor of the present application and laid open on Apr. 1, 1987 (Assignee: Hitachi Co., Ltd. Corresponding U.S. patent application Ser. No. 898599, now U.S. Pat. No. 4,780,847). Another one is the Japanese laid-open patent No. 62-291793 invented by Takashi Yamanaka and laid open on Dec. 18, 1987 (Assignee: Nippon Electric Co., Ltd.).

The Japanese laid-open patent No. 61-222090 describes the static RAM having the flash clear and flash set function. This static RAM comprises static memory cells having inverters, each of which provides a P channel pullup transistor and a data memory transistor and a pair of CMOS inverters of which an input node and output node are cross-connected as well as the set means and reset means respectively coupled to the source terminals of a pair of data memory transistors. The set operation can be realized by setting the source voltage of the data memory transistor connecting the set means to a high voltage higher than the ground voltage with the set means from such ground voltage. In the same way, the reset operation can be realized by setting the source voltage of the data memory transistor connector the reset means to a high voltage higher than the ground voltage with such reset means from the ground voltage. Although the technology disclosed by this reference seems to be somewhat similar to the present invention, it is actually significantly different in the following points. Namely, the first object of the present invention can be found in testing whether the electrical connection between the load MOSFET included in the static memory cell and the memory node to which such MOSFET is connected is normal or not. Therefore, the potential of the memory node of the memory cell connecting the source-drain path of the load MOSFET is controlled by the data set circuit DSC through such source-drain path.

Accordingly, even if the potential of the memory node connecting the source-drain path is controlled through such source-drain path of the drive MOSFET, as described in this reference, it is impossible to decide whether the connection between the source-drain path of the load MOSFET and the memory node is normal or not because the connecting part of the source-drain path of the drive MOSFET and the memory node and the connecting part of the source-drain path of the load MOSFET and the memory node are respectively provided to different regions.

The Japanese laid-open patents No. 61-71088 and No. 61-29173 discloses the reset technology in which the voltage supplied to the one of a pair of load MOSFETs or load resistors in the memory cell can be changed to the power supply voltage ($V_{cc}$) or ground potential (GND) by the control signal in order to set all memory cells of the static RAM to the predetermined reset condition. Therefore, in the above references, the memory data of the memory cell can be inverted to the logic "1" from the logic "0" (or to logic "0" from logic "1") but cannot be inverted to the logic "0" from the logic "1" and to the logic "1" from the logic "0". Moreover, these references do not suggest the testing for connections between a pair of load elements and a pair of memory nodes in the memory cell.

As explained in the embodiment of the present invention, the following effects can be attained by applying the present invention to the static RAM to be comprised in the logic integrated circuit such as a microcomputer. Namely, (1) The data held in the memory cells can be inverted freely within a short period of time by providing a pair of voltage supply lines corresponding to the two pairs of inverter circuits forming the static memory cells and providing the data set circuits to selectively supply the ground potential of circuit to the one voltage supply line while the power supply voltage of circuit is supplied to the other voltage supply line and thereby the predetermined control signal becomes effective.

(2) A failure such as disconnection occurring in the load MOSFET of static memory cell can be detected within a short period of time without changing power supply voltage and peripheral temperature by deciding the possibility of inversion of data held in the memory cell depending on the paragraph (1).

(3) From the paragraphs (1) and (2), the testing time for the information holding characteristic of memory cell of static RAM can be curtailed.

(4) The testing time of a logic integrated circuit such as a microcomputer comprising a static RAM can be curtailed and low cost can be realized from the paragraphs (1) to (3).

(5) The memory data held by the memory cells such as a static RAM can be initially set to the logic "0" or logic "1" within the short period of time from the paragraphs (1) and (2).

Figure 8:
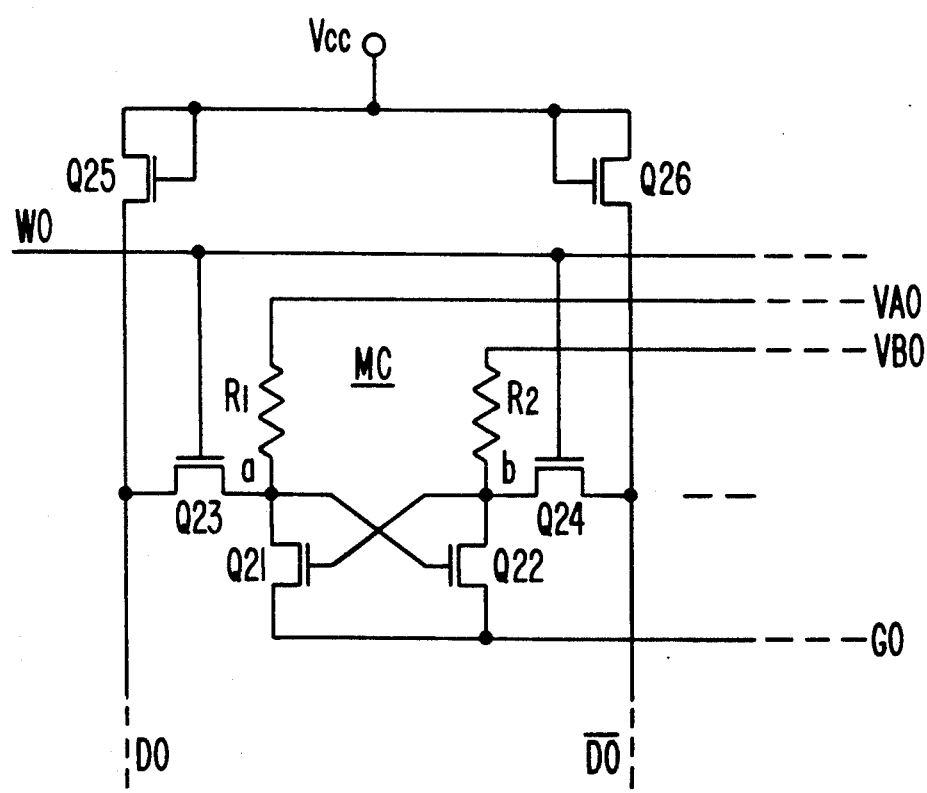
FIG. 8 is a circuit diagram showing the use of polycrystalline silicon resistor elements as load elements in the present invention.

While the invention made by the inventors of the present invention has been particularly shown and described with reference to a preferred embodiment thereof, it is to be understood that the present invention is not limited thereto in any way, but covers any and all changes and modifications without departing from the spirit and scope of the invention. For instance, in the embodiment of FIG. 1, each memory cell MC may be replaced with a high resistance polysilicon load or an N channel MOSFET load formed by connecting the MOSFET to operate as a diode in place of the load MOSFETs Q1 and Q2. FIG. 8 shows an example of polysilicon load resistors $R_1$ and $R_2$ as an illustration of such a high resistance load. In addition, MOSFETs $Q_{33} \sim Q_{34}$ of the data set circuit DSC may be eliminated and their gates can also be coupled to the power supply voltage $V_{cc}$ of circuit. The inverter circuits $N_1 \sim N_4$ and NOR gate circuits $NOG_1 \sim NOG_4$ of the data set circuit DSC coupled to the voltage supply lines VA$_0$~VA$_m$ and VB$_0$~VB$_m$ may be replaced with the other logic gate circuits under the condition that the logical functions are the same. Moreover, the levels of inversion timing signals $\overline{\phi_{sa}}$, $\overline{\phi_{sb}}$ and complementary internal write signals wd, $\overline{wd}$ can be combined freely. As the power supply voltage applied to the static RAM, the power supply voltage V$_{cc}$ is set to the ground potential like the ordinary ECL RAM and the ground potential of circuit is used as the negative power supply voltage, or polarity of the power supply voltage may be inverted by interchanging the P channel MOSFET and N channel MOSFET. The memory array MARY may be formed by a plurality of memory mats and the load MOSFETs Q25 Q26 and Q27~Q28 provided to the complementary data line pairs D$_0$·$\overline{D_0}$ D$_n$·$\overline{D_n}$ may be selectively set to ON, for example, by the timing signal $\phi_{ce}$. Moreover, various modes of the embodiment such as the circuit block of the static RAM of FIG. 1 and the combination of the address signal and the control signal can also be employed.

In the above explanation, the invention made by the inventors of the present invention has been applied mainly to the static RAM to be comprised in the logic integrated circuit such as a microcomputer as the application field. But the present invention is not limited to such a static RAM and, for instance, the present invention can also be applied to the discrete static RAM and other digital processors comprising static RAMs. Moreover, the static RAM includes those formed by MOSFETs, those formed by MOSFETs and bipolar transistors (so-called Bi CMOS SRAM) and static RAMs formed using gallium arsenide as the semiconductor substrate. The present invention can therefore be widely applied to a semiconductor memory device formed by the static memory cells in which at least the memory array includes a load means and a digital apparatus comprising such semiconductor memory device.

Typical effects of the present invention disclosed in this specification are as follow. Namely, the data held in the memory cells can be inverted freely within a short period of time by providing a pair of voltage supply lines corresponding to the two pairs of inverter circuits forming the static memory cells and providing the data set circuits to selectively supply the ground potential of circuit to the one voltage supply line while the power supply voltage of circuit is supplied to the other voltage supply line and thereby the determined control signal becomes effective. In addition, a failure such as disconnection occurring in the load MOSFET of the static memory cell can be detected within a short period of time without changing power supply voltage and peripheral temperature by deciding the possibility of inversion of data held in the memory cell. Thereby the testing time of the logic integrated circuit such as a microcomputer comprising a static RAM can be curtailed and low cost can also be realized.

What is claimed is:

1. A semiconductor integrated circuit device comprising:
    a first terminal to which a first voltage is supplied;
    a second terminal to which a second voltage is supplied, the second voltage being lower than the first voltage;
    storage means for storing data having one of either a first state and a second state different from the first state therein, the storage means including:
    first to fourth nodes, the third and fourth nodes being coupled to the second terminal,
    a first load element having a first end coupled to the first node and a second end,
    a second load element having a first end coupled to the second node and a second end,
    a first MOSFET having a source coupled to the third node, a gate coupled to the second end of the second load element and a drain, and
    a second MOSFET having a source coupled to the fourth node, a drain coupled to the gate of the first MOSFET and a gate coupled to the drain of the first MOSFET and the second end of the first load element,
    wherein the storage means further has a first storage node defined by a gate capacitance of the second MOSFET, a second storage node defined by a gate capacitance of the first MOSFET, a first connection point defining a connection point of the second end of the first load element and the gate of the second MOSFET, and a second connection point defining a connection point of the second end of the second load element and the gate of the first MOSFET, wherein the first and second storage nodes respectively become first and second voltage levels when the storage means stores the data having the first state, and wherein the first and second storage nodes respectively become the second and first voltage levels when the storage means stores data having the second state;
    a pair of data lines coupled to the first and second storage nodes of the storage means, respectively;
    read means coupled to the pair of data lines for reading out data stored in the first and second storage nodes of the storage means via the pair of data lines when the semiconductor integrated circuit device is in a read mode;
    write means coupled to the pair of data lines for writing data into the first and second storage nodes of the storage means via the pair of data lines when the semiconductor integrated circuit device is in a first write mode; and
    supply means coupled to the first and second nodes of the storage means and to the first and second terminals for supplying the first voltage to both the first and second nodes when the semiconductor integrated circuit device is in the read mode and when the semiconductor integrated circuit device is in the first write mode, supplying the first and second voltages to the first and second nodes, respectively, when the semiconductor integrated circuit device is in a second write mode where data having the first state is attempted to be written into the first and second storage nodes via the first and second connection points to test an electrical connection of one of the first and second connection points by determining whether or not inversion of the states of the first and second storage nodes occurs, and supplying the first and second voltages to the second and first nodes, respectively, when the semiconductor integrated circuit device is in a third write mode where data having the second state is attempted to be written into the first and second storage nodes via the first and second connection points to test an electrical connection of the other of the first and second connection points by determining whether or not inversion of the states of the first and second storage nodes occurs.

2. A semiconductor integrated circuit device according to claim 1, further comprising a central processing unit coupled to the read and write means for receiving data from, and generating data to, the storage means.

3. A semiconductor integrated circuit device according to claim 1, wherein the first and second MOSFETs are of an N channel type, wherein the first load element is a P channel MOSFET having a source-drain path coupled between the first node and the first connection point, and a gate coupled to the gate of the first MOSFET, and wherein the second load element is a P channel MOSFET having a source-drain path coupled between the second node and the second connection point, and a gate coupled to the gate of the second MOSFET.

4. A semiconductor integrated circuit device according to claim 3 wherein the semiconductor integrated circuit device includes a plurality of said storage means.

5. A semiconductor integrated circuit device according to claim 1, further comprising:

control means for providing a first control signal having one of either first and second levels to the supply means, wherein the write means provides a second control signal having either the first or second level to the supply means depending on the data to be written into the storage means in the second and third write modes, wherein the supply means supplies the first voltage to the first and second nodes when receiving the first control signal of the first level, wherein the supply means supplies the first and second voltages to the first and second nodes, respectively, when receiving the first control signal of the second level and the second control signal of the first level, and wherein the supply means supplies the first and second voltages to the second and first nodes, respectively, when receiving the first control signal of the second level and the second control signal of the second level.

6. A semiconductor integrated circuit device according to claim 5, wherein the supply means includes a first logic circuit having an output coupled to the first node, a first input coupled to receive the first control signal and a second input coupled to receive the second control signal, and a second logic circuit having an output coupled to the second node, a first input coupled to receive the first control signal and a second input coupled to receive a third control signal which is complementary to the second control signal.

7. A semiconductor integrated circuit device according to claim 6, wherein the supply means further includes a third MOSFET having a drain coupled to the third and fourth nodes, a source coupled to the second terminal and a gate coupled to receive a fourth control signal, and a fourth MOSFET having a drain coupled to the drain of the third MOSFET, a source coupled to the source of the third MOSFET and a gate coupled to the drain thereof, and wherein the third MOSFET is turned on in the read and write modes and is turned off in the second and third write modes.

8. A semiconductor integrated circuit device according to claim 6, wherein the first and second MOSFETs are of an N channel type, wherein the first load element is a P channel MOSFET having a source-drain path coupled between the first node and the first connection point, and a gate coupled to the gate of the first MOSFET, and wherein the second load element is a P channel MOSFET having a source-drain path coupled between the second node and the second connection point, and a gate coupled to the gate of the second MOSFET.

9. A semiconductor integrated circuit device according to claim 8, wherein the semiconductor integrated circuit device includes a plurality of said storage means.

* * * * *